(12) United States Patent
Gallivan et al.

(10) Patent No.: US 7,378,914 B2
(45) Date of Patent: May 27, 2008

(54) SOLID-STATE HIGH-POWER OSCILLATORS

(75) Inventors: James R. Gallivan, Pomona, CA (US); Kenneth W. Brown, Yucaipa, CA (US)

(73) Assignee: Raytheon Company, Waltham, MA (US)

( * ) Notice: Subject to any disclaimer, the term of this patent is extended or adjusted under 35 U.S.C. 154(b) by 116 days.

(21) Appl. No.: 11/343,632

(22) Filed: Jan. 31, 2006

(65) Prior Publication Data

US 2007/0176700 A1    Aug. 2, 2007

(51) Int. Cl.
    *H04B 7/10* (2006.01)
(52) U.S. Cl. .................. 331/79; 331/82; 343/754; 343/755; 333/21 A; 342/361
(58) Field of Classification Search ............ 331/6, 331/79, 80, 81, 82, 83, 97, 104; 343/786, 343/754, 755, 700 MS; 333/21 A, 134; 342/361
    See application file for complete search history.

(56) References Cited

U.S. PATENT DOCUMENTS

| | | | | |
|---|---|---|---|---|
| 5,214,394 | A * | 5/1993 | Wong | 330/286 |
| 5,481,223 | A | 1/1996 | Wong | |
| 7,151,494 | B2 * | 12/2006 | Brown et al. | 343/700 MS |
| 2002/0018282 | A1 * | 2/2002 | Rosenberg et al. | 359/276 |

OTHER PUBLICATIONS

Moonil Kim et al., A 6.5 Ghz-11.5 GHz Source Using a Grid Amplifier with a Twist Reflector, Oct. 1993, IEEE Transactions on Microwave Theory and Techniques, vol. 41, No. 10, pp. 1772-1774.*

* cited by examiner

*Primary Examiner*—Robert J. Pascal
*Assistant Examiner*—Ryan J Johnson
(74) *Attorney, Agent, or Firm*—Schwegman, Lundberg & Woessner P.A.; Gregory J. Gorrie

(57) ABSTRACT

Embodiments of High-Power Millimeter-Wave Oscillators are generally described herein. Other embodiments may be described and claimed. In some embodiments, the oscillator includes a polarized partial reflector to at least partially reflect back signals to a reflection array amplifier to help induce oscillation by individual sub-array amplifier elements of the reflection array amplifier. In some other embodiments, the oscillator includes a phase-graded polarization-sensitive reflection plate to at least partially reflect back signals to the reflection array amplifier to help induce an oscillation by the sub-array amplifier elements. In some embodiments, the oscillator includes a reflector and a phase-graded polarized reflection-transmission plate to at least partially pass through signals to the reflector for reflection back to the reflection array amplifier to help induce an oscillation by the sub-array amplifier elements.

27 Claims, 9 Drawing Sheets

HIGH POWER OSCILLATOR

HIGH POWER OSCILLATOR

HIGH POWER OSCILLATOR

HIGH POWER OSCILLATOR

EXAMPLE OF PHASE GRADED PLATE WITH A
LINEAR PHASE SHIFT IN ONE PLANE

HIGH POWER OSCILLATOR

SUB-ARRAY AMPLIFIER ELEMENT

SOLID-STATE HIGH-POWER OSCILLATORS

TECHNICAL FIELD

Some embodiments of the present invention pertain to high-power solid-state oscillators. Some embodiments of the present invention pertain to high-power millimeter-wave oscillators and high-power millimeter-wave frequency sources.

BACKGROUND

Many high-power signals are conventionally generated by the amplification of signals from a low-power oscillator or frequency source. These conventional systems are generally inefficient, produce excessive heat and may not be applicable to solid-state implementations. Some of these conventional systems, such as systems that use vacuum tubes, are highly complex and expensive. Furthermore, it is difficult to provide a given source power output with some of these conventional systems.

Thus, there are general needs for high-power frequency sources and oscillators that consume less power, allow for heat dissipation, and are suitable for solid-state implementations. There are also general needs for high-power frequency sources and oscillators that are less complex and less expensive. There are also general needs for high-power frequency sources and oscillators that can provide a given source power output.

SUMMARY

A high-power millimeter-wave oscillator includes a polarized partial reflector to at least partially reflect back signals to a reflection array amplifier to help induce oscillation by individual sub-array amplifier elements of the reflection array amplifier. In some other embodiments, a high-power millimeter-wave oscillator includes a phase-graded polarization-sensitive reflection plate to at least partially reflect back signals to a reflection array amplifier to help induce an oscillation by sub-array amplifier elements. In some other embodiments, a high-power millimeter-wave oscillator includes a reflector and a phase-graded polarized reflection-transmission plate to at least partially pass through signals to the reflector for reflection back to a reflection array amplifier to help induce an oscillation by sub-array amplifier elements.

DETAILED DESCRIPTION

The following description and the drawings illustrate specific embodiments of the invention sufficiently to enable those skilled in the art to practice them. Other embodiments may incorporate structural, logical, electrical, process, and other changes. Examples merely typify possible variations. Individual components and functions are optional unless explicitly required, and the sequence of operations may vary. Portions and features of some embodiments may be included in or substituted for those of others. Embodiments of the invention set forth in the claims encompass all available equivalents of those claims. Embodiments of the invention may be referred to herein, individually or collectively, by the term "invention" merely for convenience and without intending to limit the scope of this application to any single invention or inventive concept if more than one is in fact disclosed.

Figure 1A:
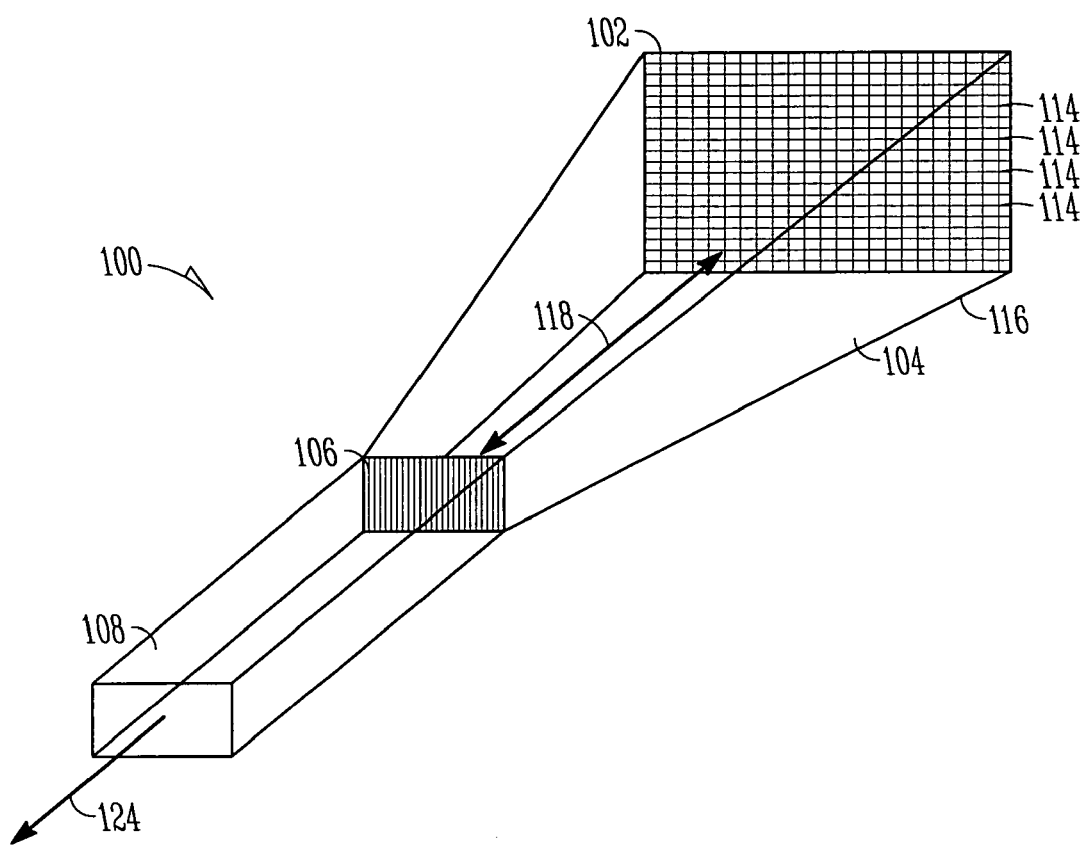
FIG. 1A illustrates a high-power oscillator in accordance with some embodiments of the present invention.

FIG. 1A illustrates a high-power millimeter-wave oscillator in accordance with some embodiments of the present invention. Oscillator 100 may be used to produce high-power output 124. In some embodiments, oscillator 100 may be a millimeter-wave high-power oscillator or frequency source and may comprise reflection array amplifier 102 to receive millimeter-wave signals of a first polarization and to retransmit the signals with a second polarization,. Oscillator 100 may also include polarized partial reflector 106 to at least partially reflect back signals to reflection array amplifier 102 to help induce an oscillation in the sub-array amplifier elements 114. The signals reflected back to reflection array amplifier 102 may have the first polarization so that they can be received by reflection array amplifier 102. Reflection array amplifier 102 may comprise a plurality of sub-array amplifier elements 114 described in more detail below. In some embodiments, polarization separation may be used to drive the array of sub-array amplifier elements 114 without the need for inefficient signal injection techniques, although the scope of the invention is not limited in this respect.

In some embodiments, polarized partial reflector 106 may have a polarization angle selected to allow polarized partial reflector 106 to pass a substantial portion of energy of the millimeter-wave signals having the second polarization to output 124. In these embodiments, the polarization angle may also be selected to reflect a remaining portion of the energy of the millimeter-wave signals of the second polarization. In some embodiments, the first and second polarizations may be substantially orthogonal, although the scope of the invention is not limited in this respect.

In some embodiments, the portion of energy of signals having the second polarization passed by polarized partial reflector 106 may be up to ninety percent or more. In some embodiments, the polarization angle may be selected to reflect as little as ten percent or less of the energy of the signals of the second polarization. In some embodiments, the polarization angle of polarized partial reflector 106 may allow a substantial portion of energy of signals having the second polarization to pass through polarized partial reflector 106 into waveguide 108, although the scope of the invention is not limited in this respect. In some embodiments, the first polarization may be horizontal and the second polarization may be vertical, although the scope of the invention is not limited in this respect as the terms 'vertical' and 'horizontal' may be interchanged.

In some embodiments, oscillator 100 may comprise tuned cavity 104 separating reflection array amplifier 102 from polarized partial reflector 106. These embodiments are discussed in more detail below.

In some embodiments, the signals reflected from polarized partial reflector 106 may have substantially the first polarization so that they may be received by reflection array amplifier 102 to help induce an oscillation in sub-array amplifier elements 114. In these embodiments, the signals reflected from polarized partial reflector 106 with substantially the first polarization may be generated from the remaining (i.e., the reflected) portion of the energy of the signals received at polarized partial reflector 106 with the second polarization. In other words, when signals are reflected by polarized partial reflector 106, they may undergo an orthogonal polarization shift. This is because when polarized partial reflector 106 is rotated (i.e., has a polarization angle greater than zero) with respect to the incoming wave (e.g., the signals with the second/vertical polarization), the incoming wave is converted into two orthogonal vectorial components. Polarized partial reflector 106 passes one component and reflects the other component back to reflection array amplifier 102.

Initially, in some embodiments, the noise level from the amplifiers of sub-array amplifier elements 114 may be high enough to allow the reflected energy to increase the energy level output of reflection array amplifier 102 to a desired level while at that same time, reflection array amplifier 102 may become phase locked (e.g., to a common average phase), although the scope of the invention is not limited in this respect.

In some embodiments, the polarization angle may be an angle that polarized partial reflector 106 may be rotated with respect to one of either the first or the second polarization. For example, if the first polarization is horizontal and the second polarization is vertical, the polarization angle may be an angle (e.g., up to a few degrees) in which polarized partial reflector 106 is rotated from vertical so that a small portion of the energy of the signals of the vertical polarization is reflected. In some embodiments, the polarization angle may range from a few degrees to up to ten or more degrees, although the scope of the invention is not limited in this respect. In some embodiments, the amount of power reflected back to reflection array amplifier 102 may be up to ten percent or more, however this amount may be as little as one percent or less to greater than twenty percent or more, although the scope of the invention is not limited in this respect.

In some embodiments, polarized partial reflector 106 may be positioned at phase distance 118 from reflection array amplifier 102 to cause a Fabry-Perot type oscillation. In these Fabry-Perot embodiments, a Fabry-Perot oscillation may occur at frequencies which are resonant inside tuned cavity 104. In these Fabry-Perot embodiments, oscillator 100 may have maximum transmission at those frequencies, although the scope of the invention is not limited in this respect. In a steady-state operational condition, the amount of energy reflected from polarized partial reflector 106 back to reflection array amplifier 102 may be sufficient to induce sub-array amplifier elements 114 to produce enough radiation to produce output 124. In general, high-power oscillator operates without phase cancellation within cavity 104, although the scope of the invention is not limited in this respect.

In some embodiments, the polarization angle of polarized partial reflector 106 and phase distance 118 may be selected for meeting performance parameters such as power output level, oscillation frequency, phase correctness, taper and mode control. In some embodiments, the polarization angle may be adjustable to maximize one or more of these parameters. Polarized partial reflector 106 may be physically rotated to adjust the polarization angle, although the scope of the invention is not limited in this respect.

In some embodiments, tuned cavity 104 may comprise waveguide horn section 116. Reflection array amplifier 102 may be located at a larger end of horn section 116 as illustrated. Polarized partial reflector 106 may be located at an opposite end of horn section 116 to define tuned cavity 104, although the scope of the invention is not limited in this respect.

In some embodiments, the signals of the second polarization may be spatially combined in-phase within the tuned cavity 104 to produce output 124. In some embodiments, the signals of the second polarization may be spatially combined in-phase within horn section 116 to provide a high-power output. In some embodiments, output 124 may be a high-power output wavefront within output waveguide 108, although the scope of the invention is not limited in this respect.

In some embodiments, tuned cavity 104 may be coupled to an output waveguide 108 and polarized partial reflector 106 may be located at least partially within output waveguide 108, although the scope of the invention is not limited in this respect. In some embodiments, the placement of reflection array amplifier 102 at the larger end of horn section 116 (e.g., external to a waveguide) may facilitate easier heat removal. For example, a heat sink and/or other heat removal apparatus may be coupled to array amplifier 102. In some embodiments, polarized partial reflector 106 may comprise one or more reflection elements. In some embodiments, polarized partial reflector 106 may comprise a metallic grid or screen-like structure. For example, parallel wires may be used, or a transparent substrate with parallel reflecting lines therein may be used (e.g., for linear polarization).

In some alternate embodiments, polarized partial reflector 106 may comprise a discontinuity within tuned cavity 104, although the scope of the invention is not limited in this respect. Examples of these embodiments are discussed in more detail below.

In some embodiments, reflection array amplifier 102 may comprise a single semiconductor wafer having the plurality of sub-array amplifier elements 114 fabricated thereon. Each of sub-array amplifier elements 114 may comprise a receive antenna to receive the signals of the first polarization, signal amplification circuitry to amplify the received signals, and a transmit antenna to transmit the signals with the second polarization. Although each sub-array amplifier element 114 may operate independently, the effect of tuned cavity 104 may allow sub-array amplifier elements 114 to oscillate together at substantially the same oscillation frequency, although the scope of the invention is not limited in this respect.

Figure 1B:
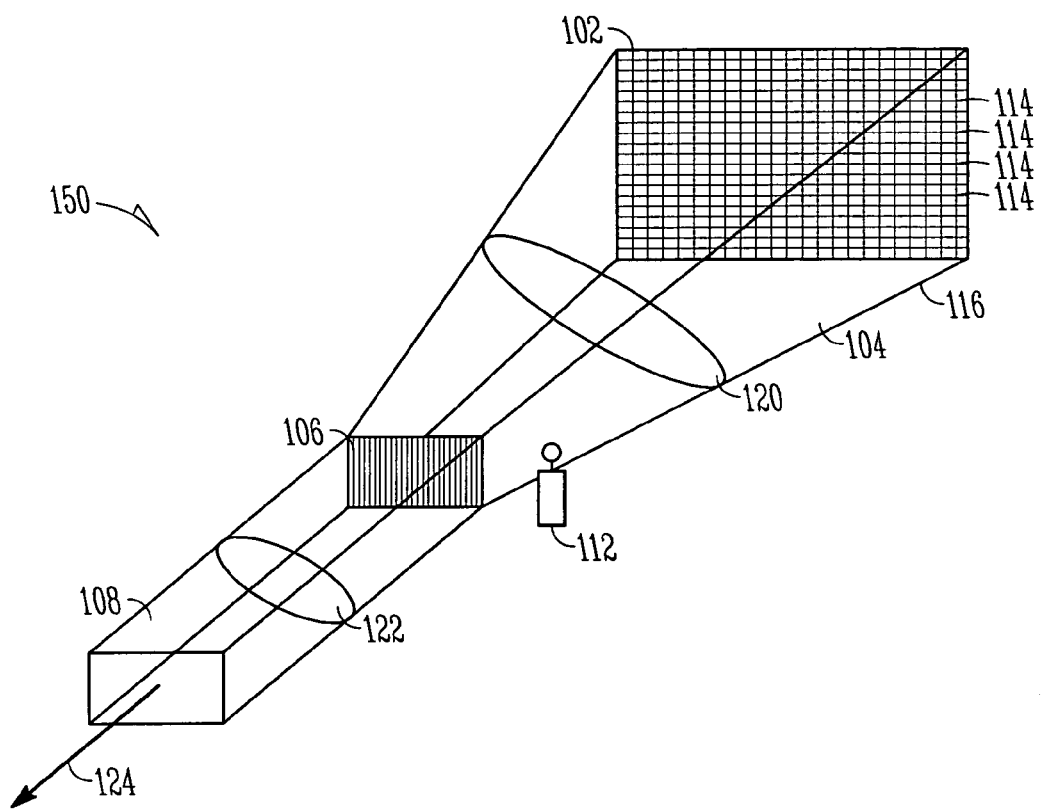
FIG. 1B illustrates a high-power oscillator in accordance with some alternate embodiments of the present invention.

FIG. 1B illustrates a high-power millimeter-wave oscillator in accordance with some alternate embodiments of the present invention. High-power oscillator 150 may be similar to high-power oscillator 100 (FIG. 1A) and may further include one or more focusing elements and/or a signal probe discussed in more detail below.

In these embodiments, oscillator 150 may comprise focusing element 120 within tuned cavity 104 to help focus energy between reflection array amplifier 102 and polarized partial reflector 106. In some embodiments, waveguide horn section 116 may act as a focusing element, although the scope of the invention is not limited in this respect. In some embodiments, oscillator 150 may also comprise focusing element 122 on the output side of polarized partial reflector 106 to help focus energy of output 124. In these embodiments, waveguide 108 may not be necessary, although the scope of the invention is not limited in this respect. Focusing element 122 may be provided in addition to or in lieu of focusing element 120.

In some embodiments, oscillator 150 may include signal probe 112 to inject a phase-locking signal into tuned cavity 104 to help phase lock the oscillator. In some other embodiments, including the embodiments illustrated in FIG. 1A, an injection or phase-locking signal may be applied to one or more of sub-array amplifier elements 114 of reflection array amplifier 102, although the scope of the invention is not limited in this respect. In these embodiments, the phase-locking signal may help induce the oscillation in reflection array amplifier 102, although the scope of the invention is not limited in this respect.

In some embodiments, sub-array amplifier elements 114 may be phase-locked by injection of a reflected signal, although the scope of the invention is not limited in this respect. In these embodiments, signal probe 112 may serve as a discontinuity within tuned cavity 104 for reflecting signals to induce an oscillation in reflection array amplifier 102, although the scope of the invention is not limited in this respect.

Figure 2:
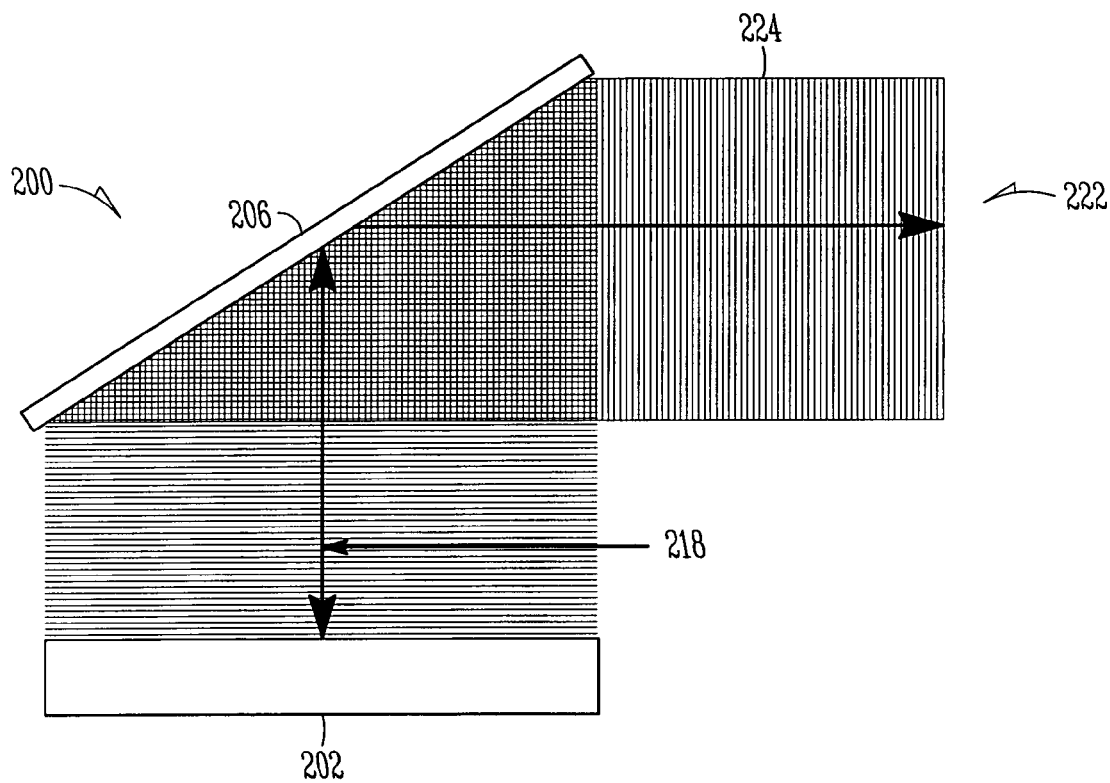
FIG. 2 illustrates a high-power oscillator in accordance with some other embodiments of the present invention.

FIG. 2 illustrates a high-power oscillator in accordance with some other embodiments of the present invention. In these embodiments, high-power oscillator 200 may be a millimeter wave oscillator and may comprise reflection array amplifier 202 to receive millimeter-wave signals of a first polarization and retransmit the millimeter-wave signals with a second polarization. In these embodiments, high-power oscillator 200 may also include phase-graded reflection plate 206 to at least partially reflect back the millimeter-wave signals to reflection array amplifier 202 to help induce an oscillation by the sub-array amplifier elements. Phase-graded reflection plate 206 may be positioned at an angle with respect to a wavefront generated by reflection array amplifier 202.

Phase-graded reflection plate 206 may be phase-graded and polarization-sensitive to reflect a substantial portion of energy of the millimeter-wave signals having the second polarization in an output direction 222. Phase-graded reflection plate 206 may also be phase-graded to reflect a remaining portion of energy of signals having the second polarization in a direction to reflection array amplifier 202. The signals reflected back to reflection array amplifier 202 may have the first polarization due to the characteristics of phase-graded reflection plate 206. In some embodiments, the portion of energy of signals having the second polarization reflected in output direction 222 by phase-graded reflection plate 206 may be up to ninety percent or more. In some embodiments, phase-graded reflection plate 206 may reflect back to reflection array amplifier 202 as little as ten percent or less of the energy of the signals of the second polarization. In some embodiments, phase-graded reflection plate 206 may be positioned at approximately forty-five degrees with respect to a wavefront generated by reflection array amplifier 202. In these embodiments, output direction 222 may be at about ninety degrees with respect to the wavefront generated by reflection array amplifier 202, although the scope of the invention is not limited in this respect, as other reflection angles may be selected.

In some embodiments, phase distance 218 between phase-graded reflection plate 206 and reflection array amplifier 202 may be selected to induce oscillation by the sub-array amplifier elements of reflection array amplifier 202. In some embodiments, phase distance 218 may be a Fabry-Perot phase distance selected to induce a Fabry-Perot type of oscillation, although the scope of the invention is not limited in this respect.

In some embodiments, phase-graded reflection plate 206 may have a polarization angle selected to reflect a portion of energy of signals received with the second polarization back in the direction to reflection array amplifier 202. The polarization angle may be an amount that phase-graded reflection plate 206 is rotated slightly with respect to one of the polarizations. In these embodiments, the amount of rotation of phase-graded reflection plate 206 with respect to the received wave (i.e., with the second polarization) determines how much energy is split between the phases. One phase is reflected in output direction 222 and the other phase is reflected in the direction back to reflection array amplifier 202.

Figure 3:
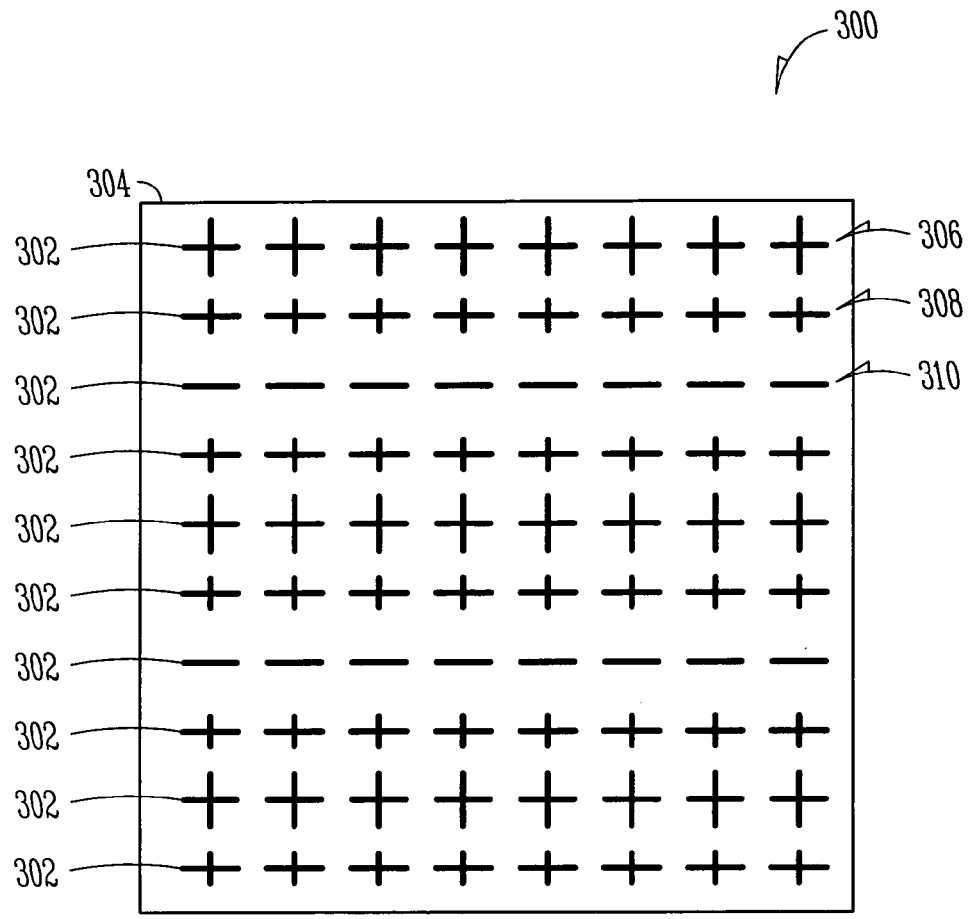
FIG. 3 illustrates a phase-graded reflection plate in accordance with some embodiments of the present invention.

FIG. 3 illustrates a phase-graded reflection plate in accordance with some embodiments of the present invention. Phase-graded reflection plate 300 may be suitable for use as phase-graded reflection plate 206 (FIG. 2), although other phase-graded reflection plates may also be suitable.

Phase-graded reflection plate 300 may be phase-graded to provide a substantially linear phase-shift to signals having a first polarization and a substantially constant phase-shift (i.e., a fixed phase-shift) to signals having a second (i.e., orthogonal) polarization. In some embodiments, the substantially linear phase-shift may be provided in a first plane and the substantially constant phase-shift may be provided in a second plane orthogonal to the first plane, although the scope of the invention is not limited in this respect. In some embodiments, the characteristics of phase-graded reflection plate 300 may be selected so that an output wavefront, such as output wavefront 222 (FIG. 2), may be a substantially planar or collimated wavefront, a diverging wavefront or a converging wavefront.

In some embodiments, phase-graded reflection plate 300 comprises a plurality of reflective elements 302 on non-reflective surface 304. In the embodiments illustrated in FIG. 3, at least some of reflective elements 302 may have a plus '+' shape or a cross 'x' shape. Reflective elements 302 may have arms in a first plane and a second plane. The length of the arms may be selected to provide an amount of phase-shift in one of the planes. In the embodiments illustrated in FIG. 3, elements 302 of row 306 may provide an equal phase-shift in both planes because the arms of elements 302 are the same length. Elements 302 of row 308 may provide less phase-shift in the vertical plane than in the horizontal plane because the vertical arms are smaller than the horizontal arms of elements 302. Elements 302 of row 310 may provide even less phase-shift in the vertical plane than the elements of row 308. As illustrated in FIG. 3, a linear phase-shift is provided in the vertical plane while a constant phase-shift is provided in the horizontal plane, although the scope of the invention is not limited in this respect.

Phase-graded reflection plate 300 may provide an independent phase-shift in both polarizations to produce optimized phase fronts for each polarization. This may allow such effects as undoing tilts or adding focusing power to a particular independent orthogonal polarization, although the scope of the invention is not limited in this respect. In some embodiments, an independent phase-shift in both polarizations may be selected to produce a millimeter-wave beam that may be focused at a predetermined distance, although the scope of the invention is not limited in this respect.

In these embodiments, a phase front of the output may be preserved to be flat to help keep an output beam collimated or planar. Because phase-graded reflection plate 300 may be tilted or angled with respect to a sources such as reflection array amplifier 202 (FIG. 2), the energy to reach phase-graded reflection plate 300 from the source may be phase-shifted by the additional distance further along phase-graded reflection plate 300. In these embodiments, elements 302 of phase-graded reflection plate 300 are designed so that phase-shifts are added to phase-graded reflection plate 300 to electrically make plate 300 look like it is flat and not tilted. For example, for a part of phase-graded reflection plate 300 is a half wavelength further away than another part of phase-graded reflection plate 300, a phase-shift of a quarter wavelength may be added to make the total path the beam takes a half wavelength further. This may produce reflections in-phase with the reflections from other sections of phase-graded reflection plate 300. Elements 302 of phase-graded reflection plate 300 may further be designed so that the phase-shifts in the other plane provides a near-total reflection of a flat phase-front of the oscillator section to remain flat and thus collimated as it exits in an output direction, such as output direction 222 (FIG. 2). In some embodiments, changing phase-shifts across phase-graded reflection plate 300 may be used to change the wavefront of the output beam to correct for system optical aberrations or focus at some distance, although the scope of the invention is not limited in this respect.

In some embodiments, reflective elements 302 of phase-graded reflection plate 300 may be copper or another conductive material. Non-reflective surface 304 may be a dielectric material, although the scope of the invention is not limited in this respect.

Figure 4:
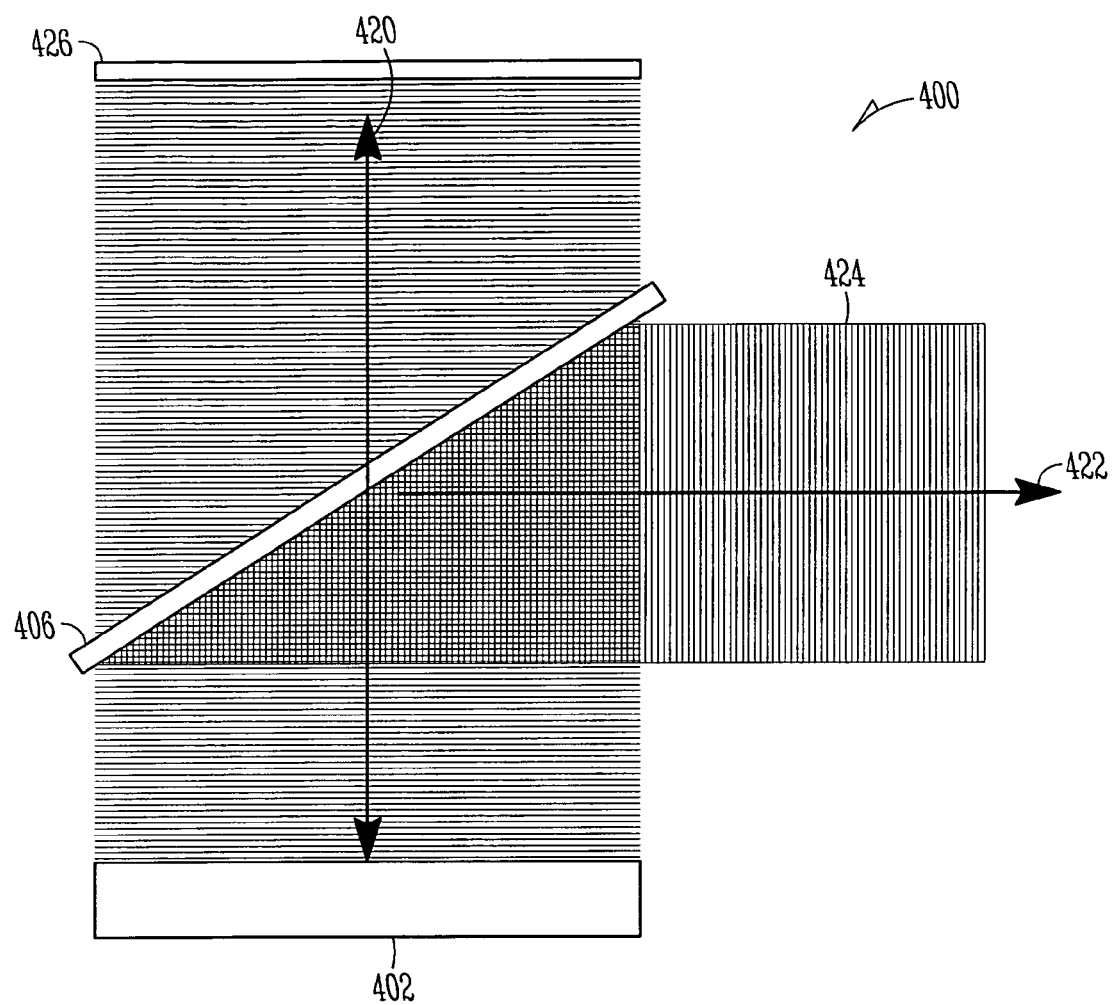
FIG. 4 illustrates a high-power oscillator in accordance with yet some other embodiments of the present invention.

FIG. 4 illustrates a high-power oscillator in accordance with yet some other embodiments of the present invention. High-power oscillator 400 may also be high-power millimeter-wave oscillator or frequency source and may comprise reflection array amplifier 402 to receive signals of a first polarization and retransmit the signals with a second polarization. High-power oscillator 400 may also comprise reflector 426 and phase-graded polarized reflection-transmission plate 406 to at least partially pass through signals to reflector 426 for reflection back to reflection array amplifier 402 to help induce an oscillation in sub-array amplifier elements of reflection array amplifier 402. In these embodiments, reflector 426 is positioned behind phase-graded polarized reflection-transmission plate 406.

In some of these embodiments, phase-graded polarized reflection-transmission plate 406 may be positioned at an angle with respect to a wavefront generated by reflection array amplifier 402. Phase-graded polarized reflection-transmission plate 406 may be phase-graded and polarized to reflect a substantial portion of energy of millimeter-wave signals having the second polarization in an output direction 422. Phase-graded polarized reflection-transmission plate 406 may also be phase-graded and polarized to transmit (i.e., pass through) a remaining portion of energy of the millimeter-wave signals having the second polarization in through-direction 420 to reflector 426. In these embodiments, reflector 426 may reflect substantially all the energy back through phase-graded polarized reflection-transmission plate 406 for reception by reflection array amplifier 402.

In the embodiments illustrated in FIG. 4, phase-graded polarized reflection-transmission plate 406 may be positioned at approximately forty-five degrees with respect to a wavefront generated by reflection array amplifier 402. In these embodiments, output direction 422 may be at about ninety degrees with respect to the wavefront generated by reflection array amplifier 402, although the scope of the invention is not limited in this respect, as other reflection angles may be selected.

In some embodiments, the portion of energy of the millimeter-wave signals having the second polarization reflected in output direction 422 by phase-graded polarized reflection-transmission plate 406 may be up to ninety percent or more. In some embodiments, phase-graded polarized reflection-transmission plate 406 may pass/transmit as little as ten percent or less of the energy of the signals of the second polarization.

The energy passing through phase-graded polarized reflection-transmission plate 406 may be of the correct polarization to pass back through phase-graded polarized reflection-transmission plate 406 after reflection by reflector 426. Without phase-graded polarized reflection-transmission plate 406, the area between reflection array amplifier 402 and reflector 426 may be viewed as an oscillating cavity.

In some embodiments, phase-graded polarized reflection-transmission plate 406 may have a polarization angle selected to transmit through the remaining portion of energy of signals having the second polarization to reflector 426. Phase-graded polarized reflection-transmission plate 406 may split the energy from reflection array amplifier into two components having different polarizations.

In some embodiments, a phase distance between reflector 426 and reflection array amplifier 402 may be selected to induce an oscillation by the sub-array amplifier elements. In some embodiments, the phase distance may be a Fabry-Perot phase distance selected to induce Fabry-Perot type oscillation, although the scope of the invention is not limited in this respect. In some embodiments, output wavefront in direction 422 may be selected to be a substantially planar or collimated wavefront, a diverging wavefront or a converging wavefront.

Figure 5:
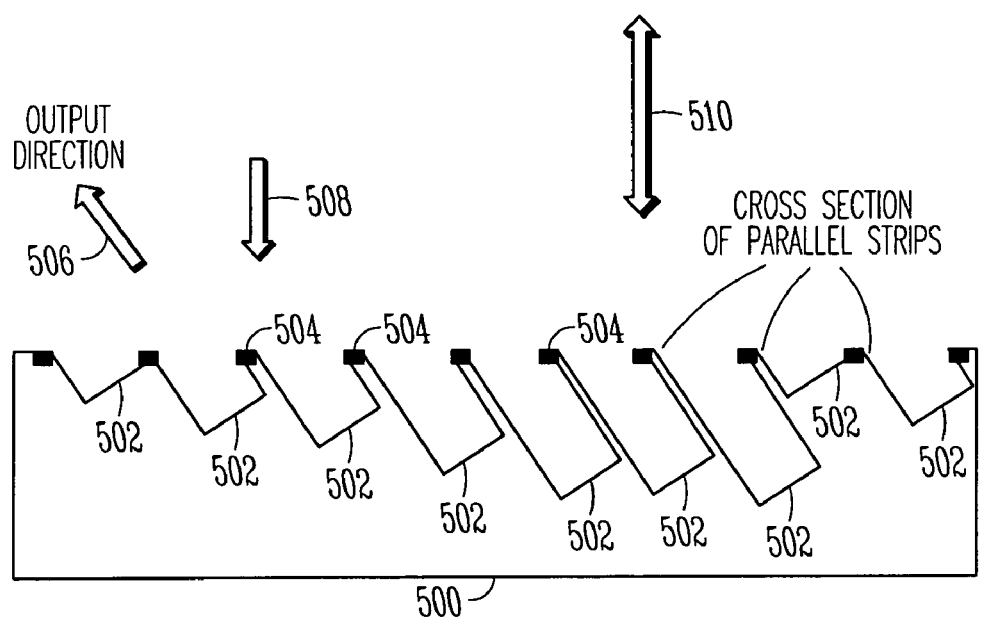
FIG. 5 is a cross-sectional view of a phase-graded reflection plate in accordance with some embodiments of the present invention.

FIG. 5 is a cross-sectional view of a phase-graded reflection plate in accordance with some embodiments of the present invention. Phase-graded reflection plate 500 may be suitable for use as phase-graded reflection plate 206 (FIG. 2), although other phase-graded reflection plates may also be suitable.

Phase-graded reflection plate 500 may have a plurality of phase-shift slots 502 or channels of varying depths to provide a linear phase-shift to signals having a first polarization. Phase-graded reflection plate 500 may also have a plurality of parallel strips 504. Parallel strips 504 may be flush with a top reflective surface of the plate to provide a substantially constant or fixed phase-shift to signals having a second polarization. The first and second polarizations may be orthogonal.

In some embodiments, phase-shift slots 502 may be angled with respect to a surface of phase-graded reflection plate 500. As illustrated in FIG. 5, phase-shift slots 502 are angled at approximately forty-five degrees with respect to the surface of phase-graded reflection plate 500, although the scope of the invention is not limited in this respect. As illustrated in FIG. 5, signals 510 with a first polarization may be reflected back in the same direction they are received from. Signals 508 with a second polarization may be reflected as output signals 506 also having the second polarization. Output signals 506 may be used to produce the output energy of a high-power oscillator or frequency source.

In some embodiments, phase-shift slots 502 may be substantially parallel to the second (e.g., the vertical) polarization allowing phase-graded reflection plate 500 to be positioned at an angle with respect to a wavefront generated by a reflection array amplifier. An example of this is illustrated in FIG. 2.

Figure 6A:
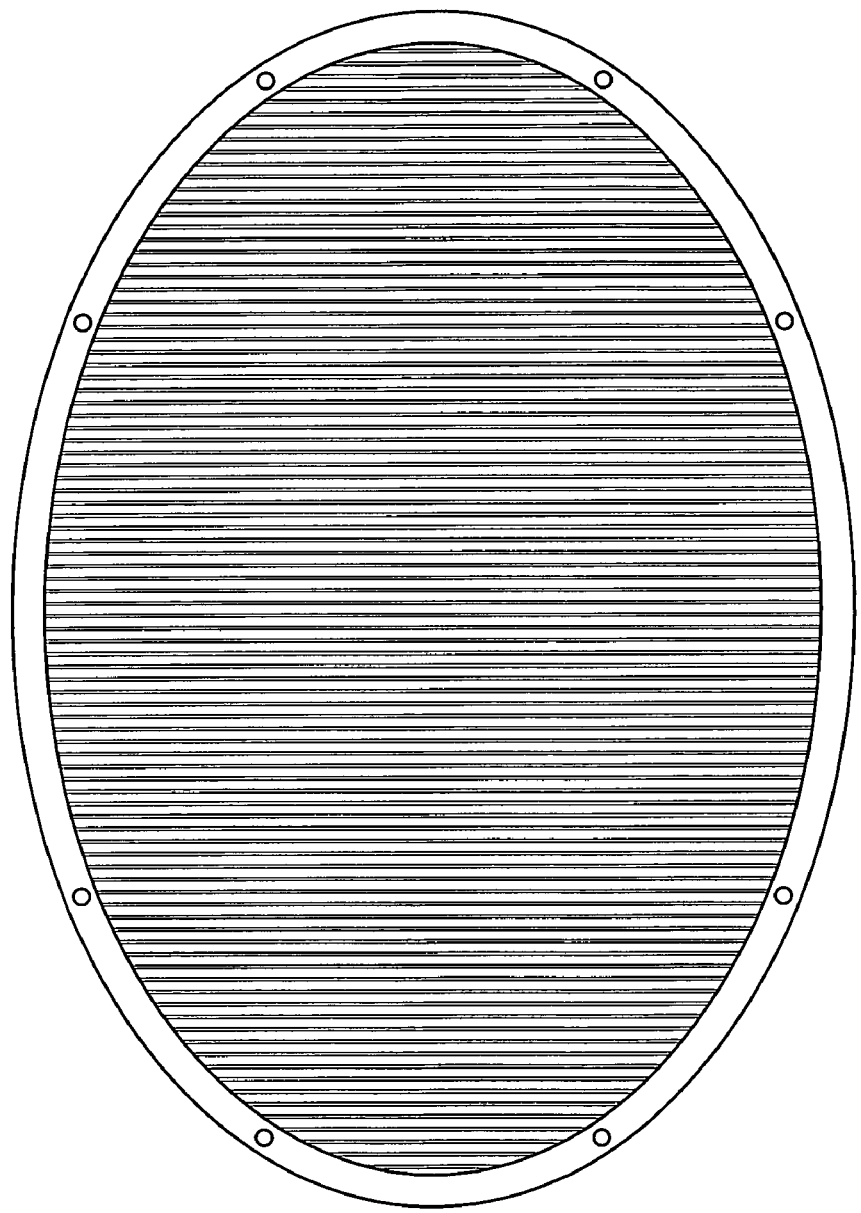
FIGS. 6A and 6B illustrate a phase-graded reflection plate in accordance with some embodiments of the present invention.
Figure 6B:
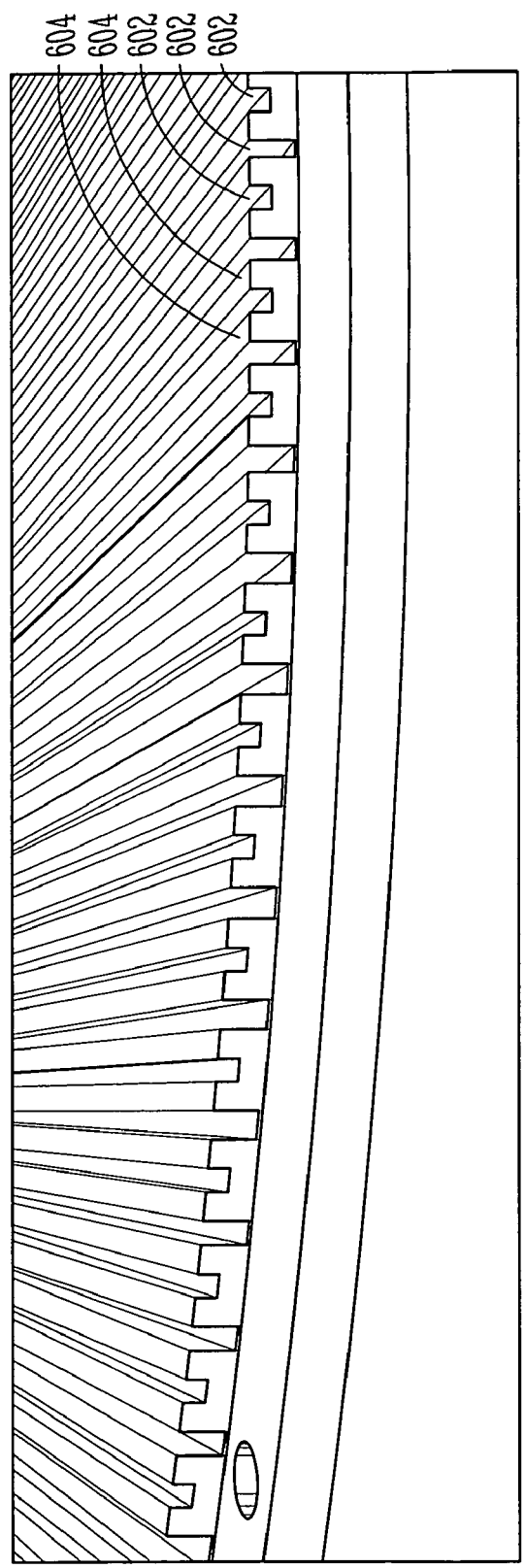

FIGS. 6A and 6B illustrate a phase-graded reflection plate in accordance with some embodiments of the present invention. Phase-graded reflection plate 600 may be suitable for use as phase-graded reflection plate 206 (FIG. 2), although other phase-graded reflection plates may be used. As illustrated in FIG. 6A, phase-graded reflection plate 600 has an oval shape because in these embodiments, it may be provided at approximately a forty-five degree angle in a circular cavity.

FIG. 6B illustrates phase-shift slots 602 which may correspond to phase-shift slots 502 (FIG. 5) and parallel reflective strips 604 which may correspond to parallel strips 504 (FIG. 5). In the embodiments of phase-graded reflection plate 600 illustrated in FIGS. 6A and 6B, phase-shift slots 602 are not angled with respect to the surface of the plate as they are in the embodiments illustrated in FIG. 5.

Although many embodiments of the present invention are applicable to millimeter-wave frequencies, the scope of the invention is not limited in this respect. Some embodiments may be equally applicable to microwave frequencies, infrared frequencies and/or optical frequencies.

Figure 7:
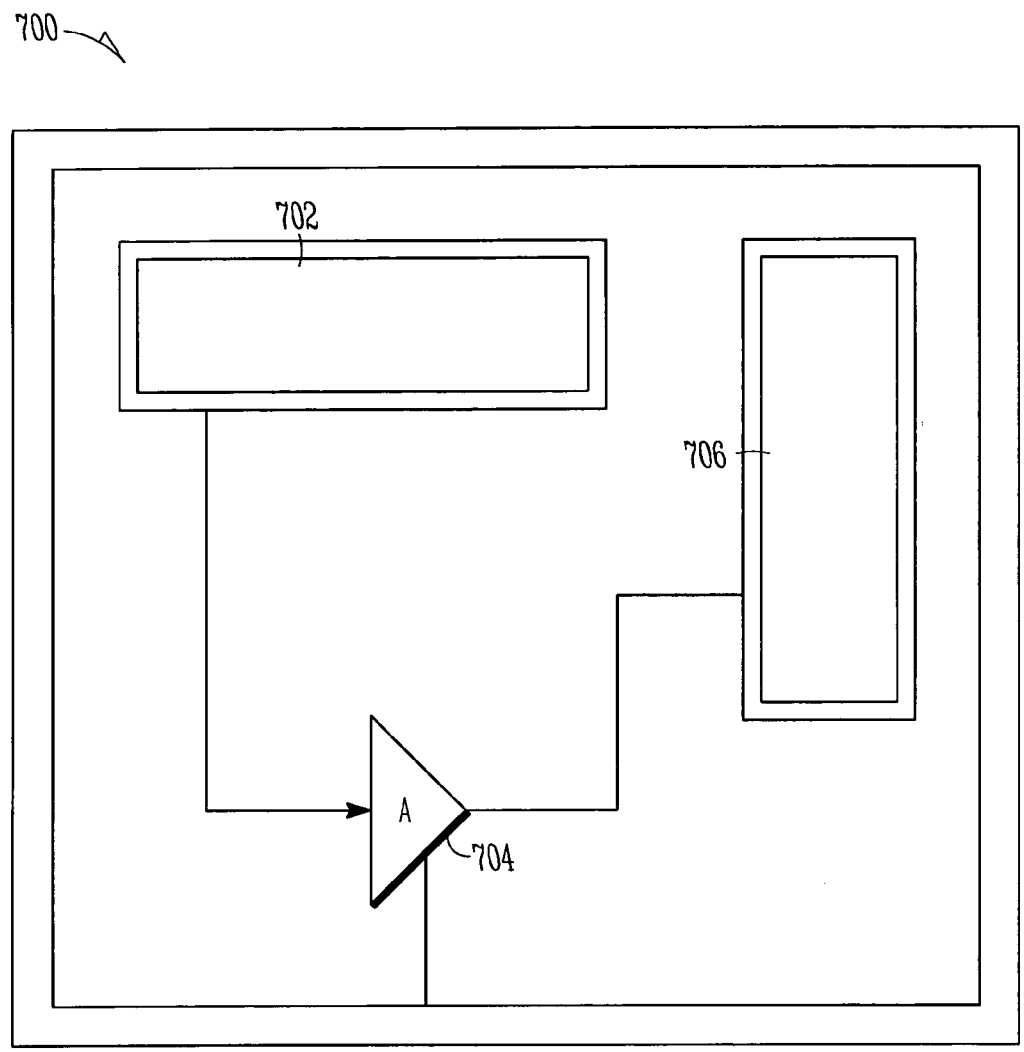
FIG. 7 illustrates a sub-array amplifier element in accordance with some embodiments of the present invention.

FIG. 7 illustrates a sub-array amplifier element in accordance with some embodiments of the present invention. Sub-array amplifier element 700 may be suitable for use as one or more of sub-array amplifier elements 114 (FIGS. 1A and 1B), although the scope of the invention is not limited in this respect. Sub-array amplifier element 700 may also be suitable for use as one or more of sub-array amplifier elements of reflection array amplifier 202 (FIG. 2) and/or reflection array amplifier 302 (FIG. 3), although the scope of the invention is not limited in this respect.

Sub-array amplifier element 700 may include receive antenna 302, amplifier element 304 and transmit antenna 306. In some embodiments, receive antenna 302 and transmit antenna 306 may have orthogonal polarizations. In some embodiments, receive antenna 302 may have a horizontal (e.g., a first) polarization so that horizontally polarized signals are received, and transmit antenna 306 may have a vertical (e.g. a second) polarization so that vertically polarized signals are transmitted.

In some embodiments, an array of sub-array elements 114 may be fabricated on the single monolithic substrate to produce a reflect array amplifier. In some embodiments, receive antenna 302 and transmit antenna 306 may be cavity-backed antennas. In these embodiments, a single integrated substrate may include cavities adjacent to the receive and transmit antennas (e.g., the cavities may be behind the antennas and aligned with the antennas). In some embodiments, a heat sink may include cavities adjacent to the receive and transmit antennas, although the scope of the invention is not limited in this respect.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims.

In the foregoing detailed description, various features are occasionally grouped together in a single embodiment for the purpose of streamlining the disclosure. This method of disclosure is not to be interpreted as reflecting an intention that the claimed embodiments of the subject matter require more features than are expressly recited in each claim. Rather, as the following claims reflect, invention may lie in less than all features of a single disclosed embodiment. Thus the following claims are hereby incorporated into the detailed description, with each claim standing on its own as a separate preferred embodiment.

What is claimed is:

1. A millimeter-wave high-power oscillator comprising:
    a reflection array amplifier having a plurality of sub-array amplifier elements to receive millimeter-wave signals of a first polarization and to retransmit the signals with a second polarization; and
    a polarized partial reflector to at least partially reflect back signals to the reflection array amplifier to help induce oscillation by the sub-array amplifier elements,
    wherein the reflection array amplifier is configured to receive the signals of the first polarization from the polarized partial reflector and retransmit the signals with the second polarization back toward the polarized partial reflector, and
    wherein the polarized partial reflector is further configured to pass a substantial portion of energy of the millimeter-wave signals having the second polarization.

2. A millimeter-wave high-power oscillator comprising:
    a reflection array amplifier having a plurality of sub-array amplifier elements to receive millimeter-wave signals of a first polarization and to retransmit the signals with a second polarization; and
    a polarized partial reflector to at least partially reflect back signals to the reflection array amplifier to help induce oscillation by the sub-array amplifier elements,
    wherein the polarized partial reflector has a polarization angle selected to allow the polarized partial reflector to pass a substantial portion of energy of the millimeter-wave signals having the second polarization to an output,
    wherein the polarization angle is further selected to reflect a remaining portion of the energy of the millimeter-wave signals of the second polarization, and
    wherein the first and second polarizations are substantially orthogonal.

3. The oscillator of claim 2 wherein the signals reflected from the polarized partial reflector have substantially the first polarization to be received by the reflection array amplifier to help induce the oscillation by the sub-array amplifier elements.

4. The oscillator of claim 3 further comprising a tuned cavity separating the reflection array amplifier from the polarized partial reflector.

5. The oscillator of claim 3 wherein the signals reflected from the polarized partial reflector have substantially the first polarization and are generated from the remaining portion of the energy of the signals received at the polarized partial reflector with the second polarization.

6. The oscillator of claim 3 wherein the polarization angle is an angle that the polarized partial reflector is rotated with respect to one of either the first or the second polarization.

7. The oscillator of claim 4 wherein the polarized partial reflector is positioned at a phase distance from the reflection array amplifier to cause a Fabry-Perot type oscillation.

8. The oscillator of claim 7 wherein the polarization angle of the polarized partial reflector and the phase distance are selected for meeting performance parameters including one or more of power output level, oscillation frequency, phase correctness, taper and mode control.

9. The oscillator of claim 4 wherein the tuned cavity comprises a waveguide horn section,
wherein the reflection array amplifier is located at a larger end of the horn section, and
wherein the polarized partial reflector is located at an opposite end of the horn section to define the tuned cavity.

10. The oscillator of claim 9 wherein the signals of the second polarization are spatially combined in-phase within the tuned cavity to produce the output.

11. The oscillator of claim 4 wherein the tuned cavity is coupled to an output waveguide, and
wherein the polarized partial reflector is located at least partially within the output waveguide.

12. The oscillator of claim 4 further comprising a focusing element within the tuned cavity to help focus energy between the reflection array amplifier and the polarized partial reflector.

13. The oscillator of claim 4 further comprising a signal probe to inject a phase-locking signal into the tuned cavity to help phase lock the oscillator.

14. The oscillator of claim 4 wherein the reflection array amplifier comprises a single semiconductor wafer having the plurality of the sub-array amplifier elements fabricated thereon, and
wherein each of the sub-array amplifier elements comprise a receive antenna to receive the signals of the first polarization, signal amplification circuitry to amplify the received signals, and a transmit antenna to transmit the signals of the second polarization.

15. A millimeter-wave high-power oscillator comprising:
a reflection array amplifier having a plurality of sub-array amplifier elements to receive millimeter-wave signals of a first polarization and to retransmit the signals with a second polarization; and
a polarized partial reflector to at least partially reflect back signals to the reflection array amplifier to help induce oscillation by the sub-array amplifier elements,
wherein the polarized partial reflector comprises a discontinuity within a tuned cavity.

16. A millimeter-wave high-power oscillator comprising:
a reflection array amplifier having a plurality of sub-array amplifier elements to receive millimeter-wave signals of a first polarization and retransmit the millimeter-wave signals with a second polarization; and
a phase-graded reflection plate to at least partially reflect back the millimeter-wave signals to the reflection array amplifier to help induce an oscillation by the sub-array amplifier elements,
wherein the phase-graded reflection plate is positioned at an angle with respect to a wavefront generated by the reflection array amplifier,
wherein the reflection plate is phase-graded to reflect a substantial portion of energy of the millimeter-wave signals having the second polarization in an output direction, and
wherein the reflection plate is further phase-graded to reflect a remaining portion of energy of signals having the second polarization in a direction to the reflection array amplifier.

17. The oscillator of claim 16 wherein a distance between the phase-graded reflection plate and the reflection array amplifier is selected to induce oscillation by the sub-array amplifier elements.

18. The oscillator of claim 17 wherein the phase-graded reflection plate has a polarization angle selected to reflect the remaining portion of energy of signals having the second polarization back in the direction to the reflection array amplifier.

19. The oscillator of claim 17 wherein the phase-graded reflection plate is phase-graded to provide a substantially linear phase-shift to signals having the first polarization and a substantially constant phase-shift to signals having the second polarization.

20. The oscillator of claim 19 wherein the phase-graded reflection plate comprises a plurality of reflective elements on a non-reflective surface,
wherein at least some of the reflective elements have either a plus '+' shape or a cross 'x' shape, the reflective elements having arms in a first plane and a second plane, wherein a length of the arms is selected to provide an amount of phase-shift in one of the planes.

21. The oscillator of claim 18 wherein the phase-graded reflection plate has a plurality of phase-shift slots of varying depths to provide the linear phase-shift to signals having the first polarization, and
wherein phase-graded reflection plate further has a plurality of parallel strips flush with a reflective surface of the plate to provide a substantially constant phase-shift to signals having the second polarization.

22. The oscillator of claim 21 wherein the phase-shift slots are angled with respect to a surface of phase-graded reflection plate.

23. A millimeter-wave high-power oscillator comprising:
a reflection array amplifier having a plurality of sub-array amplifier elements to receive signals of a first polarization and retransmit the signals with a second polarization;
a reflector; and
a phase-graded polarized reflection-transmission plate to at least partially pass through signals to the reflector for reflection back through the phase-graded polarized reflection-transmission plate to the reflection array amplifier to help induce an oscillation by the sub-array amplifier elements,
wherein the reflection array amplifier is configured to receive the signals of the first polarization from the phase-graded polarized reflection-transmission plate and retransmit the signals with the second polarization back toward the phase-graded polarized reflection-transmission plate.

24. The oscillator of claim 23 wherein the reflector is positioned behind the phase-graded polarized reflection-transmission plate to reflect signals back through the phase-graded polarized reflection-transmission plate.

25. A millimeter-wave high-power oscillator comprising:
a reflection array amplifier having a plurality of sub-array amplifier elements to receive signals of a first polarization and retransmit the signals with a second polarization;
a reflector; and
a phase-graded polarized reflection-transmission plate to at least partially pass through signals to the reflector for reflection back to the reflection array amplifier to help induce an oscillation by the sub-array amplifier elements,
wherein the reflector is positioned behind the phase-graded polarized reflection-transmission plate,
wherein the phase-graded polarized reflection-transmission plate is positioned at an angle with respect to a wavefront generated by the reflection array amplifier, wherein the phase-graded polarized reflection-transmission plate is phase-graded and polarized to reflect a substantial portion of energy of millimeter-wave signals having the second polarization in an output direction, and wherein the phase-graded polarized reflection-transmission plate is further phase-graded and polarized to transmit a remaining portion of energy of the millimeter-wave signals having the second polarization to the reflector.

26. The oscillator of claim 25 wherein the phase-graded polarized reflection-transmission plate has a polarization angle selected to transmit through the remaining portion of energy of signals having the second polarization to the reflector.

27. The oscillator of claim 24 wherein a distance between the reflector and the reflection array amplifier is selected to induce an oscillation by the sub-array amplifier elements.

* * * * *